(12) United States Patent  
Wang et al.

(10) Patent No.: US 12,057,536 B2  
(45) Date of Patent: Aug. 6, 2024

(54) BACKPLANE, BACKLIGHT SOURCE, DISPLAY DEVICE AND MANUFACTURING METHOD OF BACKPLANE

(71) Applicant: BOE TECHNOLOGY GROUP CO., LTD., Beijing (CN)

(72) Inventors: Ke Wang, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1066 days.

(21) Appl. No.: 16/957,766

(22) PCT Filed: Aug. 30, 2019

(86) PCT No.: PCT/CN2019/103741  
§ 371 (c)(1),  
(2) Date: Jun. 25, 2020

(87) PCT Pub. No.: WO2021/035698  
PCT Pub. Date: Mar. 4, 2021

(65) Prior Publication Data  
US 2022/0344554 A1    Oct. 27, 2022

(51) Int. Cl.  
*H01L 33/62* (2010.01)  
*H01L 25/075* (2006.01)  
*H01L 23/00* (2006.01)

(52) U.S. Cl.  
CPC .......... *H01L 33/62* (2013.01); *H01L 25/0753* (2013.01); *H01L 24/32* (2013.01);  
(Continued)

(58) Field of Classification Search  
CPC ..... H01L 33/62; H01L 25/0753; H01L 24/32; H01L 2224/32245; H01L 2924/12041; H01L 2933/0066; H01L 24/81; H01L 24/13; H01L 24/16; H01L 2224/16227; H01L 2224/81193; H01L 21/44; H01L 2224/811; H01L 21/768; G02F 1/13  
See application file for complete search history.

(56) References Cited

U.S. PATENT DOCUMENTS 7,340,829 B2 *  3/2008  Wang ..................... H05K 3/242  
                                                          29/853  
9,018,539 B2 *  4/2015  Lee ....................... H05K 3/0035  
                                                          174/262  
(Continued)

FOREIGN PATENT DOCUMENTS

CN         1753162 A       3/2006  
CN       101740478 A       6/2010  
(Continued)

*Primary Examiner* — Ratisha Mehta  
(74) *Attorney, Agent, or Firm* — DINSMORE & SHOHL LLP

(57) ABSTRACT

The present disclosure relates to a backplane, a backlight source, a display device, and a manufacturing method of the backplane. The backplane includes: a substrate; a plurality of barriers disposed on a surface of the substrate; and a first metal layer disposed on the surface of the substrate and including a plurality of metal patterns spaced apart by the plurality of barriers, wherein the barrier and the metal pattern are connected by a concave-convex mating structure.

8 Claims, 5 Drawing Sheets

(52) U.S. Cl.
CPC ............... *H01L 2224/32245* (2013.01); *H01L 2924/12041* (2013.01); *H01L 2933/0066* (2013.01)

(56) References Cited

U.S. PATENT DOCUMENTS

2006/0202331 A1    9/2006  Hu
2006/0204650 A1*   9/2006  Hu .................. H05K 3/243
                                                      427/256
2008/0179190 A1*   7/2008  Hu .................. H01L 21/4853
                                                    257/E23.068

FOREIGN PATENT DOCUMENTS

| CN | 102509705 A | 6/2012 |
| CN | 104576923 A | 4/2015 |
| JP | 2001093933 A | 4/2001 |
| JP | 2014045131 A | 3/2014 |

* cited by examiner

BACKPLANE, BACKLIGHT SOURCE, DISPLAY DEVICE AND MANUFACTURING METHOD OF BACKPLANE

CROSS-REFERENCE TO RELATED APPLICATIONS

The present application is a U.S. National Stage Application under 35 U.S.C. § 371 of International Patent Application No. PCT/CN2019/103741, filed on Aug. 30, 2019, the disclosure which is incorporated by reference herein in its entirety.

TECHNICAL FIELD

The present disclosure relates to a backplane, a backlight source, a display device, and a manufacturing method of a backplane.

BACKGROUND

High-Dynamic Range (HDR) technology may significantly enhance the contrast of the Liquid Crystal Display (LCD), and HDR rendering requires high contrast, fast response and superb color representation. In some related arts, the surface light source backlight of multi-partition local dimming micro LED is in collaboration with the high-gamut Quantum Dot film to realize the HDR technology, so that the display effect may be significantly improved.

SUMMARY

According to one aspect of the present disclosure, a backplane is provided. The backplane includes: a substrate; a plurality of barriers disposed on a surface of the substrate; and a first metal layer disposed on the surface of the substrate and including a plurality of metal patterns spaced apart by the plurality of barriers, wherein the barrier and the metal pattern are connected by a concave-convex mating structure.

In some embodiments, the metal pattern includes: a first portion disposed on the surface of the substrate; and a second portion disposed on a surface of the first portion on one side away from the substrate, wherein the barrier and the second portion are connected by the concave-convex mating structure.

In some embodiments, the concave-convex mating structure includes: a convex portion located on one side of the second portion that is in contact with the barrier, and protruding toward the barrier; and a concave portion located on one side of the barrier that is in contact with the second portion, and recessed toward one side of the barrier that is away from the second portion, wherein the convex portion is embedded in the concave portion, and an outer contour of the convex portion is closely attached to an inner contour of the concave portion.

In some embodiments, a surface of the convex portion on one side adjacent to the first portion is flush with a surface of the second portion on one side adjacent to the first portion.

In some embodiments, a thickness of each of the first metal layer and the plurality of barriers is 10 to 20 μm.

In some embodiments, the backplane further including: a first passivation layer disposed on one side of the first metal layer and the plurality of barriers away from the substrate; and a second metal layer disposed on one side of the first passivation layer away from the substrate, and electrically connected to the first metal layer through a via hole; and a second passivation layer disposed on one side of the first passivation layer away from the substrate, and covering the first metal layer.

According to one aspect of the present disclosure, a backlight source is provided. The backlight source includes the aforementioned backplane; and a plurality of light-emitting diode chips, wherein the plurality of light-emitting diode chips are disposed on the backplane.

In some embodiments, the light-emitting diode chips include a Mini-LED chip or a Micro-LED chip.

According to one aspect of the present disclosure, a display device is provided. The display device includes aforementioned backplane or aforementioned backlight source.

According to one aspect of the present disclosure, a manufacturing method of a backplane is provided. The manufacturing method of a backplane includes: providing a substrate; and forming a first metal layer and a plurality of barriers on a surface of the substrate, wherein the first metal layer includes a plurality of metal patterns spaced apart by the plurality of barriers, and the barriers are connected to the metal patterns by a concave-convex mating structure.

In some embodiments, forming the first metal layer and the plurality of barriers includes: forming a first portion of the plurality of metal patterns on a surface of the substrate; forming the plurality of barriers that space apart the first portions of the plurality of metal patterns on a surface of the substrate; and forming a second portion of the plurality of metal patterns spaced apart by the plurality of barriers on surfaces of the first portions of the plurality of metal patterns in an electroplating manner respectively, wherein the barrier is connected to the second portion by the concave-convex mating structure.

In some embodiments, forming a first portion includes: forming a seed layer on the substrate; forming a sacrificial layer on the seed layer; etching a part of the sacrificial layer by a first etching process at corresponding positions where the plurality of barriers are located on the substrate to form a first opening of the sacrificial layer; and etching a part of the seed layer by a second etching process at corresponding positions where the plurality of barriers are located on the substrate to form a second opening of the seed layer and expose a surface of the substrate, wherein an orthographic projection of the first opening on the substrate is located within that of the second opening on the substrate, and a width of the first opening is smaller than that of the second opening, so that a recessed portion with respect to the sacrificial layer is formed on the seed layer.

In some embodiments, forming a plurality of barriers includes: forming the plurality of barriers at positions of the substrate corresponding to the first opening and the second opening, and filling the recessed portion with the plurality of barriers, wherein a thickness of each barrier is greater than a sum of a thickness of the seed layer and a thickness of the sacrificial layer; and etching all the sacrificial layers using the first etching process, so as to form a concave portion corresponding to the sacrificial layer on the plurality of barriers.

In some embodiments, forming a second portion includes: forming second portions on surfaces of the first portions of the plurality of metal patterns on one side away from the substrate in an electroplating manner, and forming the second portion with a convex portion filling the concave portion.

In some embodiments, the second etching process uses a second etching medium to wet etch a material of the seed layer, such that an etching rate of the material of the seed layer by the second etching medium is faster than that of a material of the sacrificial layer by the second etching medium, and the first etching process uses a first etching medium to wet etch the material of the sacrificial layer, such that an etching rate of the material of the sacrificial layer by the first etching medium is faster than that of the material of the seed layer by the first etching medium.

In some embodiments, the material of the seed layer is copper, and the second etching medium is an oxydol series etchant; and the material of the sacrificial layer is indium tin oxide, and the first etching medium is a sulphuric acid series etchant.

In some embodiments, the seed layer has a thickness of 300 to 500 nm, and the sacrificial layer has a thickness of 100 to 200 nm.

In some embodiments, a difference between a width of the second opening and a width of the first opening is 3 to 4 μm.

In some embodiments, the manufacturing method of a backplane further includes: forming a first passivation layer covering the first metal layer and the plurality of barriers on one side of the first metal layer and the plurality of barriers away from the substrate; forming a via hole in the first passivation layer, and forming a second metal layer on one side of the first passivation layer away from the substrate, wherein the second metal layer is electrically connected to the first metal layer through the via hole; and providing a second passivation layer on one side of the first passivation layer away from the substrate, and covering the first metal layer by the second passivation layer.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
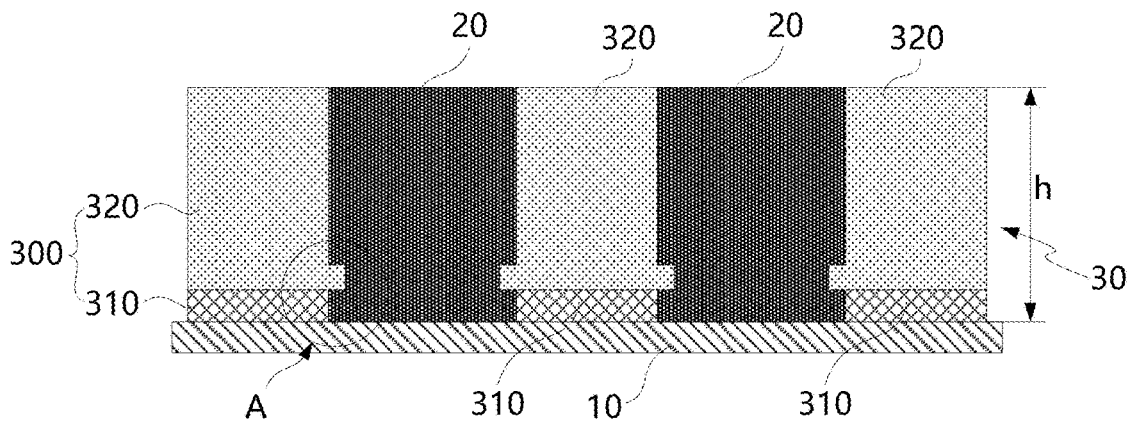
FIG. 1 is a schematic structural view of an embodiment of a backplane according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "contain" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The multi-partition surface light source backlight technology uses a large number of LED chips, with a large overall power consumption. Therefore, in some related arts, a metal layer with a high thickness is formed on the glass substrate in an electroplating manner to reduce a wiring resistance of the LED chip in the multi-partition surface light source. The inventors have discovered by studies that, in order to realize the patterning of the metal layer having a high thickness, it is necessary to combine a dam material having a high thickness in use. However, the dam material having a high thickness is poorly adhered to the glass substrate and easily falls off, so that it is difficult to form a patterned metal layer having a high thickness in an electroplating manner.

In view of this, the embodiments of the present disclosure provide a backplane, a backlight source, a display device, and a manufacturing method of a backplane, which can improve a bonding force between the barrier and the substrate.

Figure 2:
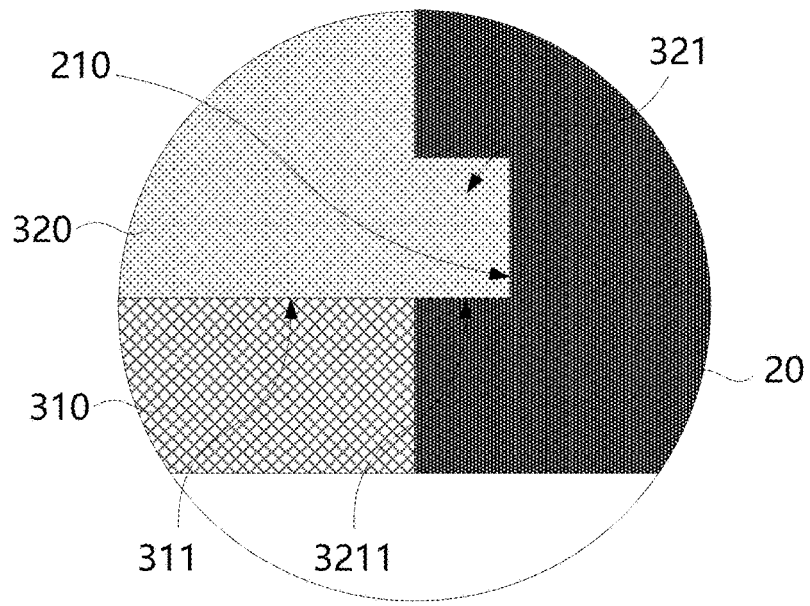
FIG. 2 is an enlarged schematic view of a circle A in FIG. 1.

FIG. 1 is a schematic structural view of an embodiment of a backplane according to the present disclosure. FIG. 2 is an enlarged schematic view of a circle A in FIG. 1. The backplane may be applied to a backlight source.

Referring to FIG. 1, in some embodiments, the backplane may include: a substrate 10, a plurality of barriers 20 and a first metal layer 30. The substrate 10 may be made from glass or other materials such as ceramics. The plurality of barriers 20 and the first metal layer 30 are all disposed on a surface of the substrate 10. As may be seen in FIG. 1, both the barrier 20 and the first metal layer 30 are in contact with the upper surface of the substrate 10, and the contacting method may be generated on the surface of the substrate, adhered to the surface of the substrate, or the like. The barrier 20 may be made from an electrically insulating material, such as polyimide (PI), polyacrylic acid resin and the like, which may partition the first metal layer 30 to form a plurality of metal patterns 300 included in the first metal layer 30. The metal pattern 300 which may serve as a driving circuit trace of at least a portion of the backplane may be made from a metal or alloy material with a favorable conductivity.

Referring to FIGS. 1 and 2, in some embodiments, the barrier and the metal pattern are connected by a concave-convex mating structure. When the barrier is formed on the surface of the substrate, in addition to a material adhesive effect between the barrier and the surface of the substrate, it is also possible to increase a restraint effect of the metal pattern provided to the barrier in a direction perpendicular to the surface of the substrate, thereby improving a bonding force between the barrier and the substrate, so that the barrier is not easily to fall off the substrate. In this way, it is possible to form the first metal layer having a high thickness and the barrier on the substrate having a high thickness, and by providing the metal layer having a high thickness, it is possible to reduce the resistance of the metal pattern, thereby further reducing the overall power consumption of the backlight source using the backplane of the present embodiment.

In some embodiments, the concave-convex mating structure may include a mating structure of protrusions and grooves, which may be formed in the barrier 20 and in the metal pattern 300 respectively, or may be intermediate members between the barrier 20 and the metal pattern 300. The shape of the protrusion may be a straight or curved protrusion extending along a direction parallel to the substrate 10, or may consist in a plurality of discrete block protrusions.

In some embodiments, the concave-convex mating structure between the barrier 20 and the metal pattern 300 may include: a protrusion located on a side wall of the barrier 20 and a groove located on a side wall of the metal pattern 300 and mated with the protrusion, or a groove located on a side wall of the barrier 20 and a protrusion located on a side wall of the metal pattern 300 and mated with the groove. In other embodiments, the concave-convex mating structure between the barrier 20 and the metal pattern 300 may include: a protrusion located on a side wall of the barrier 20 and a groove located on a side wall of the metal pattern 300 and mated with the protrusion, and a groove located on a side wall of the barrier 20 and a protrusion located on a side wall of the metal pattern 300 and mated with the groove.

In some embodiments, the protrusions and the grooves may be disposed in at least one thickness position of the barrier and the metal pattern 300 in a direction perpendicular to the substrate, for example, a thickness position of 300-500 nm higher than the substrate surface and adjacent to the substrate surface, for another example, a thickness position of ½ the thickness of the barrier and the metal pattern.

In some embodiments, the thickness h of each of the first metal layer 30 and the plurality of barriers 20 may be 10 µm or more, and may further alternatively be 10 to 20 µm. In some embodiments, in order to form the first metal layer 30 with a high thickness, an electroplating process may be used to prepare the first metal layer 30 on the surface of the substrate 10. In other embodiments, the thickness h of each of the first metal layer 30 and the barrier 20 may also be less than 10 µm, and the first metal layer 30 may be prepared by an electroplating process or other preparation processes (such as evaporation, sputtering and the like).

In FIG. 1, for the first metal layer prepared by the electroplating process, the metal pattern 300 may include a first portion 310 and a second portion 320. The first portion 310 may be a patterned, which is also referred to as a seed portion hereinafter. The seed layer can provide a forming surface for the metal layer that can be subsequently formed, so that the forming quality of the metal layer is improved and a current is applied thereon, thereby conducting the substrate and the electroplating solution, so as to form an electric field within the electroplating solution to form the second portion 320 of the first metal layer. The seed layer may be formed in a manner such as evaporation, sputtering, and vapor deposition. The first portion 310 may be obtained by further treatment (for example dry etching or wet etching and the like) on the basis of the seed layer. The first portion 310 is disposed on the surface of the substrate 10, and separated from another adjacent first portion 310 by at least one barrier 20 among the plurality of barriers 20.

The second portion 320 which is formed on the first portion 310, may be formed by a process such as electroplating. The second portion 320 is disposed on the surface of the first portion 310 on one side away from the substrate 10 and separated from another adjacent second portion 320 by the at least one barrier 20. The first portion 310 and the second portion 320 may be made from the same metal or alloy material, such as copper, silver, gold, copper-zinc alloy, and copper-nickel alloy, so as to improve a close contact degree between the first portion 310 and the second portion 320 degree. In other embodiments, the first portion 310 and the second portion 320 may use different metal or alloy materials.

Referring to FIGS. 1 and 2, the concave-convex mating structure between the barrier 20 and the metal pattern 300 may be specifically formed between the barrier and the second portion. That is, the barrier and the second portion are connected by the concave-convex mating structure. The concave-convex mating structure may be formed in such a manner as to provide a sacrificial layer on the seed layer. For the specific forming process, reference may be made to the embodiment of the manufacturing method of the backplane hereinafter, which will not be described in detail here. In other embodiments, the concave-convex mating structure may also be specifically formed between the first portion and the barrier, or both between the barrier and the first portion, and between the barrier and the second portion.

Referring to FIG. 2, in some embodiments, the concave-convex mating structure includes: a convex portion 321 and a concave portion 210. The convex portion 321 is located on one side of the second portion 320 in contact with the barrier 20 and protrudes toward the barrier 20. The protruding direction of the convex portion 321 may be perpendicular to the barrier 20 or may be inclined at a preset angle. The concave portion 210 is located on one side of the barrier 20 in contact with the second portion 320 and recessed toward one side of the barrier 20 away from the second portion 320. The convex portion 321 is embedded in the concave portion 210, and the outer contour of the convex portion 321 is closely attached to the inner contour of the concave portion 210.

In FIG. 2, the convex portion 321 of the second portion 320 may form an effective restraint effect on the concave portion 210 of the barrier 20 in a direction perpendicular to the surface of the substrate 10, and can improve a bonding force between the barrier 20 and the substrate 10 as much as possible, so that the barrier 20 is less easily to fall off the substrate 10. The barrier 20 also forms a restraint effect on the second portion 320 in a direction perpendicular to the surface of the substrate 10, thereby more reliably forming the second portion 320, and reducing or avoiding that the second portion 320 and the barrier 20 are detached from the surface of the substrate 10.

In other embodiments, according to different manufacturing processes, the convex portion may be formed on the barrier, and the concave portion mated with the convex portion may be formed on the second portion correspondingly. Alternatively, the convex portions may be formed on the barrier and on the second portion, and the concave portions that are mated with the convex portions at different positions are also formed on the second portion and the barrier correspondingly.

In FIG. 2, the surface 3211 of the convex portion 321 on one side adjacent to the first portion 310 is flush with the surface 311 of the second portion 320 on one side adjacent to the first portion 310. The formation of such structure may be achieved by removing the sacrificial layer provided on the seed layer.

Figure 3:
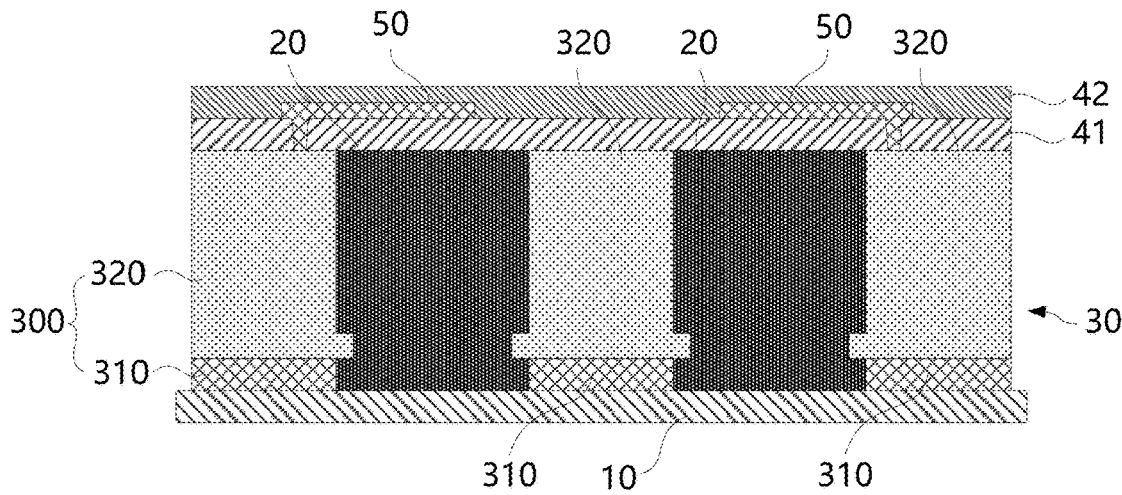
FIG. 3 is a schematic structural view of another embodiment of a backplane according to the present disclosure.

FIG. 3 is a schematic structural view of another embodiment of a backplane according to the present disclosure.

Referring to FIG. 3, in some embodiments, the backplane further includes: a first passivation layer (PVX) 41, a second passivation layer 42 and a second metal layer 50. The first passivation layer 41 may be disposed on one side of the first metal layer 30 and the plurality of barriers 20 away from the substrate 10. The first passivation layer 41 may entirely cover each metal pattern 300 and the plurality of barriers 20.

The second metal layer 50 may be made from metal or an alloy material, such as copper, silver, gold, silver-platinum alloy, and the like. The second metal layer 50 is disposed on one side of the first passivation layer 40 away from the substrate 10, and electrically connected to the first metal layer through a via hole. The second metal layer 50 may be formed as a patterned metal layer. When the backplane is applied to an LED direct-type backlight source, the different metal patterns 300 in the first metal layer 30 are conducted respectively with the different metal patterns in the second metal layer 50, and the second metal layer 50 may be connected to different pins of the LED chip respectively as the anode trace and the cathode trace on the backplane 70.

The second passivation layer 42 may be disposed on one side of the first passivation layer 41 away from the substrate 10 and cover the first metal layer 30. The first passivation layer 41 may entirely cover each metal pattern 300 and the plurality of barriers 20. The first passivation layer 41 and the second passivation layer 42 may be made from an insulating material (for example, silicon nitride, silicon oxide, silicon oxynitride and the like).

Figure 4:
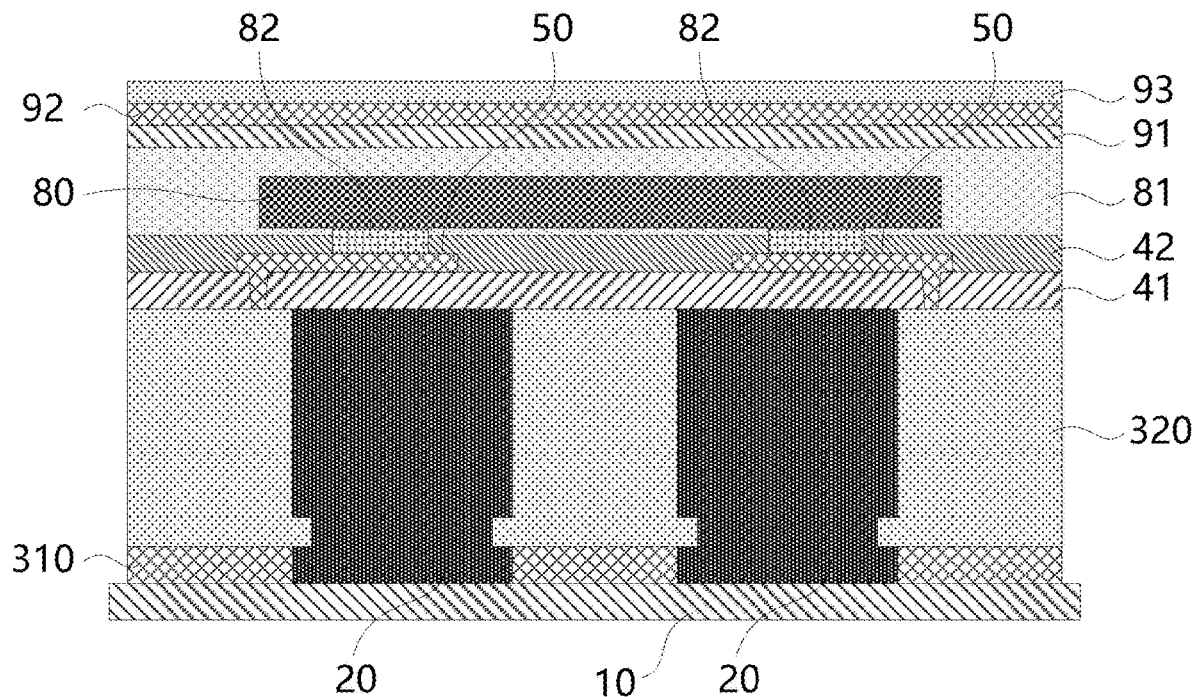
FIG. 4 is a schematic structural view of an embodiment of a backlight source according to the present disclosure.

FIG. 4 is a schematic structural view of an embodiment of a backlight source according to the present disclosure.

Referring to FIG. 4, in some embodiments, the backlight source may include the backplane in the foregoing embodiments and a plurality of LED chips 80 disposed on the backplane. The plurality of LED chips 80 may be arranged on the surface on one side of the backplane according to an array manner. When a plurality of LED chips 80 are distributed on the backplane at a high density, the surface light source providing backlight may be realized. The backplane may provide a driving circuit for the LED chip. In some embodiments, the LED chip 80 may include a Mini-LED chip with a size of approximately 100 to 200 μm, or a Micro-LED chip with a size of less than 100 μm, for example 50 μm.

In FIG. 4, the LED chip 80 may be disposed on one side of the second passivation layer 42 away from the substrate 10, wherein an opening is provided in the second passivation layer 42, and a conductive adhesive 82 is provided within the opening to realize a conductive connection between the second metal layer 50 and the pins of the LED chip. An encapsulant layer 81 may be further provided on one side of the second passivation layer 42 away from the substrate 10 to encapsulate the LED chip 80.

In addition, in FIG. 4, the backlight source may further include a quantum dot film 91 that converts a color of light, a diffusion film 92 that diffuses light, a prism film 93 that converges light, and the like. The quantum dot film 91, the diffusion film 92, and the prism film 93 may be provided layer by layer on one side of the LED chip 80 away from the substrate 10 along a light exiting direction of the LED chip 80.

The backplane in each of the foregoing embodiments or the backlight source including the backplane in the foregoing embodiments may be applied to a display device. Correspondingly, the present disclosure also provides a display device including a backplane in any one of the foregoing embodiments or a backlight source in any one of the foregoing embodiments. The display device may be any product or component with a display function, such as a mobile phone, a tablet computer, a television, a display, a notebook computer, a digital photo frame, a navigator, and the like.

Figure 5:
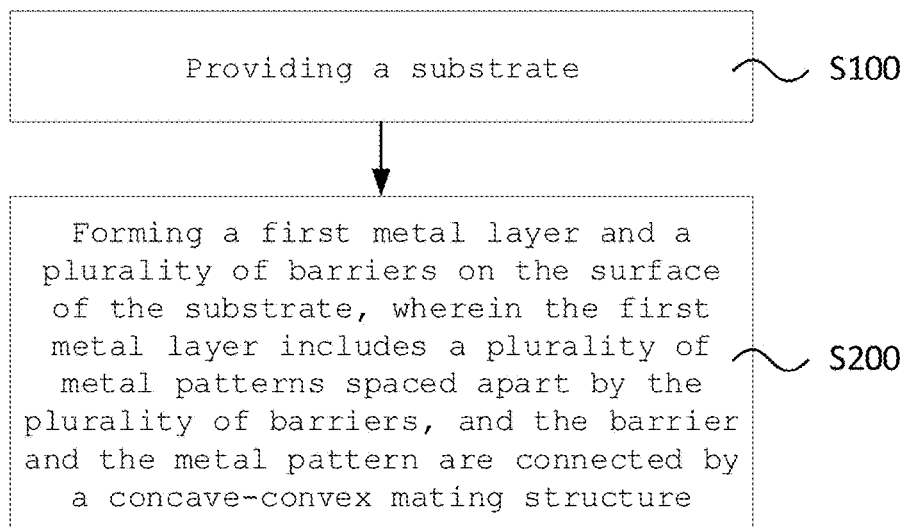
FIG. 5 is a schematic flowchart of an embodiment of a manufacturing method of a backplane according to the present disclosure.
Figure 6:
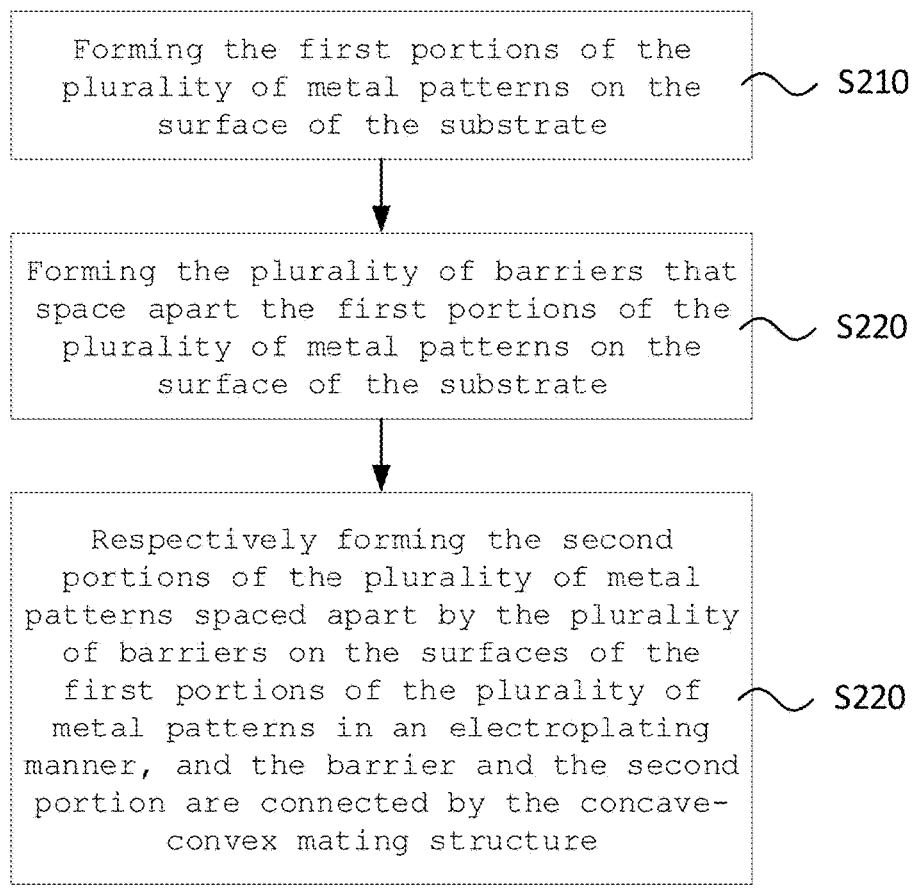
FIG. 6 is a schematic flowchart of forming a first metal layer in an embodiment of a manufacturing method of a backplane according to the present disclosure.

FIG. 5 is a schematic flowchart of an embodiment of a manufacturing method of a backplane according to the present disclosure. FIG. 6 is a schematic flowchart of forming a first metal layer in an embodiment of a manufacturing method of a backplane according to the present disclosure. FIG. 7(a)-FIG. 7(f) are schematic views of a plurality of states during a manufacturing process in an embodiment of the backplane shown in FIG. 2 respectively.

Referring to FIG. 5, in some embodiments, the manufacturing method of a backplane includes step S100 and step S200. In step S100, the substrate 10 is provided. The substrate 10 may be made from glass or other materials such as ceramics.

In step S200, a first metal layer 30 and a plurality of barriers 20 are formed on the surface of the substrate 10. The first metal layer 30 includes a plurality of metal patterns 300 spaced apart by the plurality of barriers 20. The barrier 20 and the metal pattern 300 are connected by a concave-convex mating structure.

When the barrier is formed on the surface of the substrate, in addition to a material adhesive effect between the barrier and the surface of the substrate, it is also possible to increase a restraint effect of the metal pattern provided to the barrier in a direction perpendicular to the surface of the substrate, thereby improving a bonding force between the barrier and the substrate, so that the barrier is not easily to fall off the substrate. In this way, it is possible to allow that the first metal layer with a high thickness and the barrier with a high thickness are formed on the substrate, and by providing the metal layer with a high thickness, it is possible to reduce the resistance of the metal pattern, thereby further reducing the overall power consumption of the backlight source using the backplane of the present embodiment.

Referring to FIG. 6, the steps of forming the first metal layer 30 and the plurality of barriers 20 include steps S210 to S230. In step S210, the first portions 310 of the plurality of metal patterns 300 are formed on the surface of the substrate 10. In step S220, the plurality of barriers 20 that space apart the first portions 310 of the plurality of metal patterns 300 are formed on the surface of the substrate 10. In step S230, the second portions 320 of the plurality of metal patterns 300 spaced apart by the plurality of barriers 20 are respectively formed on the surfaces of the first portions 310 of the plurality of metal patterns 300 in an electroplating manner. The barrier 20 and the second portion 320 are connected by the concave-convex mating structure.

Figure 7A:
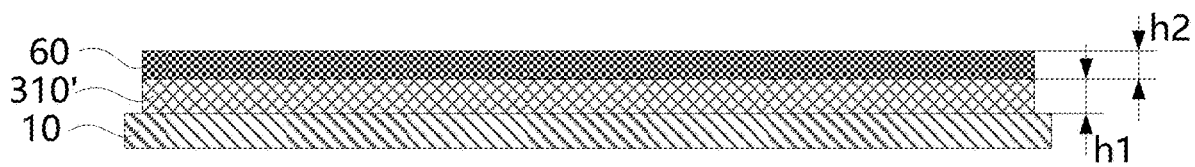
FIG. 7(a)-FIG. 7(f) are schematic views of a plurality of states during a manufacturing process in an embodiment of the backplane shown in FIG. 2 respectively.

Referring to FIGS. 7(a)-7(f), during the specific process of forming the first portion 310, a seed layer 310' may be first formed on the substrate 10; a sacrificial layer 60 is formed on the seed layer 310'. In FIG. 7(a), the thickness h1 of the seed layer 310' may optionally be 300 to 500 nm, the thickness h2 of the sacrificial layer 60 may optionally be 100 to 600 nm, and further may optionally be 100 to 200 nm.

After the sacrificial layer 60 is formed, the material of the sacrificial layer 60 and the material of the seed layer 310' may be removed respectively and the surface of the substrate 10 is exposed to form the openings of both the seed layer 310' and the sacrificial layer 60 at corresponding positions where the plurality of barriers 20 are disposed on the substrate 10. Specifically, when the opening is formed, in some embodiments, the material of the seed layer 310' and the material of the sacrificial layer 60 may be removed in a wet etching manner respectively.

Figure 7B:
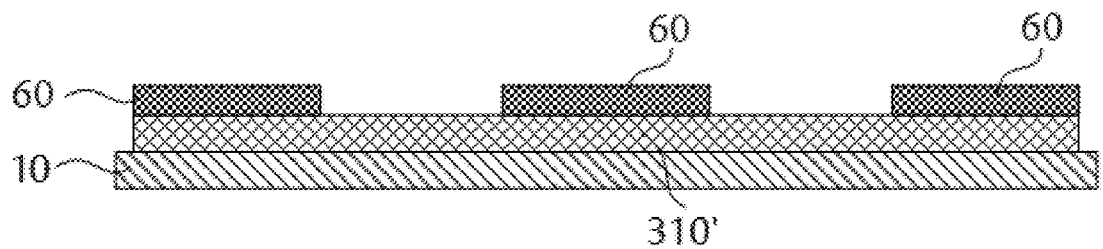

For example, referring to FIG. 7(b), at corresponding positions where the plurality of barriers 20 are disposed on the substrate 10, a part of the sacrificial layer 60 is etched by a first etching process to form a first opening of the sacrificial layer 60, thereby causing that the opening area etched of the sacrificial layer 60 exposes the seed layer 310'.

Figure 7C:
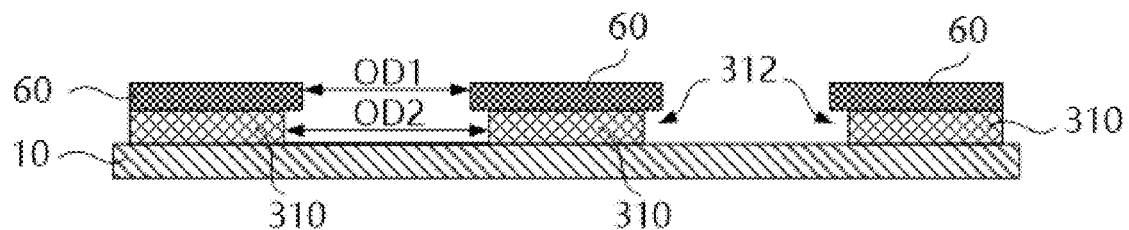
Figure 7D:
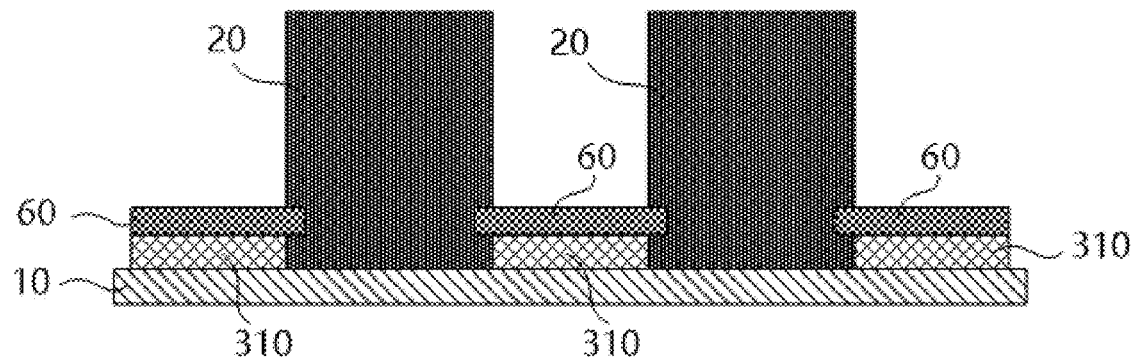

Referring to FIG. 7(c), at corresponding positions where the plurality of barriers 20 are disposed on the substrate 10, a part of the seed layer 310' is etched by a second etching process to form a second opening of the seed layer 310' and expose the surface of the substrate 10. At this time, the sacrificial layer 60 formed with the opening may serve as a hard mask of the seed layer 310', and the seed layer 310' is divided into the first portions 310 of the plurality of metal patterns 300 by the opening.

When the material of the sacrificial layer 60 is selected, it may be selected according to the material of the seed layer 310'. The second etching process uses a second etching medium to wet etch the material of the seed layer 310', and an etching rate of the material of the seed layer 310' by the second etching medium is faster than that the material of the sacrificial layer 60 by the second etching medium. The first etching process uses a first etching medium to wet etch the material of the sacrificial layer 60, and an etching rate of the material of the sacrificial layer 60 by the first etching medium is faster than the material of the seed layer 310' by the first etching medium. In this way, either of the seed layer and the sacrificial layer may be selectively etched without significantly affecting the other.

For example, the seed layer 310' is made from copper, and the copper seed layer is etched using an oxydol series etchant (for example an aqueous hydrogen peroxide solution with a mass concentration of 8%). Moreover, the sacrificial layer 60 is made from indium tin oxide (ITO), and the ITO sacrificial layer is etched using a sulphuric acid series etchant (for example, a sulfuric acid aqueous solution with a mass concentration of 5%-10%). The etching rate of copper in the oxydol series etchant is higher than that of ITO in the oxydol series etchant, while the etching rate of ITO in the sulphuric acid series etchant is higher than that of copper in the sulphuric acid series etchant.

In FIG. 7(b) and FIG. 7(c), the orthographic projection of the first opening formed in the sacrificial layer 60 on the substrate is located within the orthographic projection of the second opening formed in the seed layer 310' on the substrate by controlling parameters such as the concentration and etching time of the etchant itself, and the width OD1 of the first opening is smaller than the width OD2 of the second opening to form a recessed portion 312 relative to the sacrificial layer 60 in the seed layer 310'. The difference between the width OD2 and the width OD1 may be 1 to 5 μm, and may be further alternatively 3 to 4 μm. Such difference may be used to define the relevant parameters of the concave-convex mating structure in the subsequent steps, for example, to define a recessed depth of the concave portion 210 on the barrier 20.

After the first portion 310 is formed, referring to FIG. 7 (d) and FIG. 7 (e), the step of forming the plurality of barriers 20 that space apart the first portions 310 of the plurality of metal patterns 300 on the surface of the substrate 10 includes: forming the plurality of barriers 20 at positions of the substrate 10 corresponding to the first opening and the second opening, and filling the recessed portion 312 with the plurality of barriers 20, wherein the thickness of each barrier is greater than a sum of the thickness of the seed layer and the thickness of the sacrificial layer; all the sacrificial layers 60 are etched using the first etching process to form the concave portion 210 corresponding to the sacrificial layer 60 on the plurality of barriers 20.

Figure 7E:
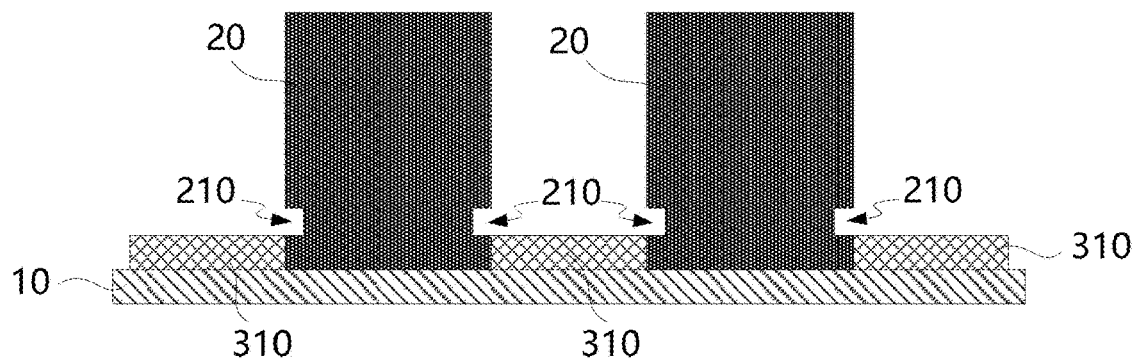

The barrier 20 may be formed on the substrate 10 at a position corresponding to the opening in a photolithographic manner. In FIG. 7 (d), when the barrier 20 is formed, the material of the barrier 20 may fill the recessed portion 312 during the formation process. At this time, the barrier 20 and the sacrificial layer 60 with an opening form a concave-convex mating structure, and a part of the sacrificial layer 60 is embedded into the concave portion 210 of a side wall of the barrier 20 as a convex portion. The portion of the barrier 20 filled into the recessed portion 312 of the seed layer 310' is also equivalent to the convex portion in the concave-convex fitting structure. In this way, the barrier 20 is subjected to a restraint effect of the sacrificial layer 60 during the formation process and is thus less easily to fall off the surface of the substrate, thereby allowing a barrier having a higher thickness to be formed. In FIG. 7(e), after the barrier 20 is formed, the sacrificial layer 60 is removed so that the first portion 310 is completely exposed, and the side wall of the barrier 20 may form the concave portion 210 as the sacrificial layer 60 is removed. For example, the sacrificial layer 60 of an ITO material is etched by a sulphuric acid series etchant, so that the sacrificial layer 60 is removed.

Figure 7F:
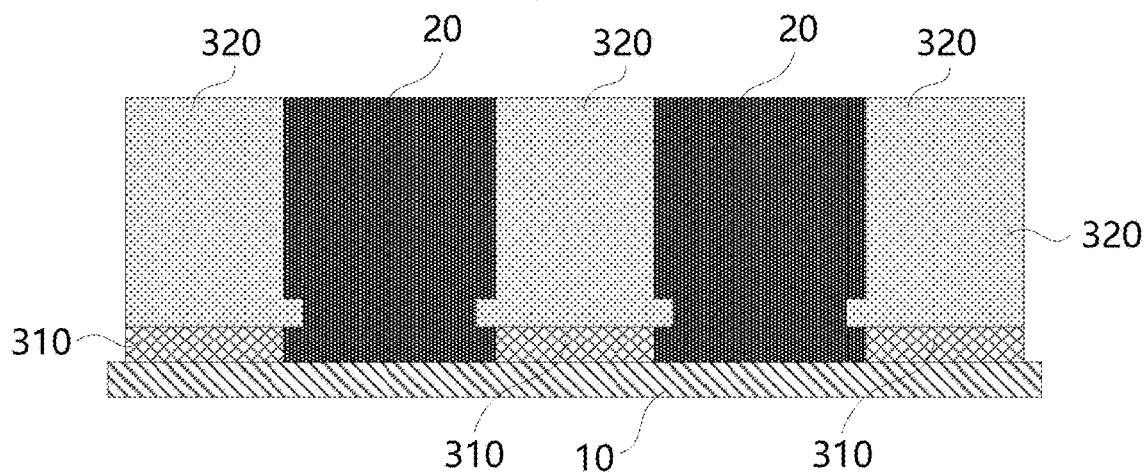

After the barrier 20 is formed and the concave portion 210 is formed by removing the sacrificial layer 60, referring to FIG. 7(f), the second portions 320 may be further formed on the surfaces of the first portions 310 of the plurality of metal patterns 300 on one side away from the substrate 10, and the second portion 320 is formed with a convex portion 321 filling the concave portion 210. The material of the second portion 320 may fill the concave portion 210 during the formation process of the electroplating layer. By a restraint effect of the convex portion 321 of the second portion 320 on the concave portion 210, it is possible to further improve a bonding force between the barrier 20 and the substrate 10 and prevent the barrier 20 from falling off the surface of the substrate 10 to cause the second portion 320 to fall off accordingly as well. In a direction perpendicular to the surface of the substrate, the thickness of the second portion 320 may be set with reference to the thickness of the barrier 20, for example, 10 to 20 μm.

Figure 8:
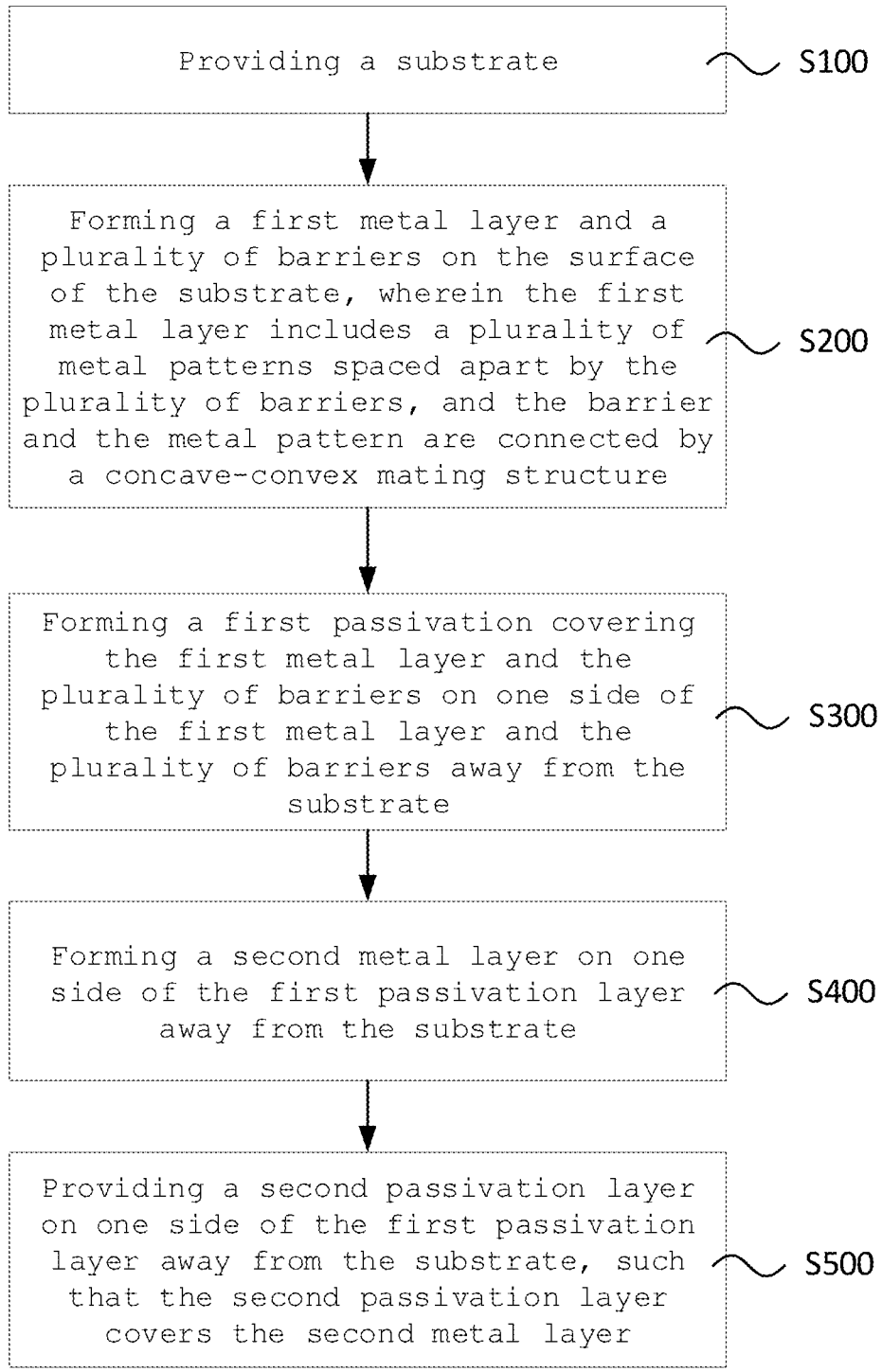
FIG. 8 is a schematic flowchart of another embodiment of a manufacturing method of a backplane according to the present disclosure.

FIG. 8 is a schematic flowchart of another embodiment of a manufacturing method of a backplane according to the present disclosure.

Compared with the embodiment shown in FIG. 5, the embodiment shown in FIG. 8 may further include steps S300 to S500 after step S200. In step S300, a first passivation 41 covering the first metal layer 30 and the plurality of barriers 20 is formed on one side of the first metal layer 30 and the plurality of barriers 20 away from the substrate 10. The first passivation layer 41 may entirely cover each metal pattern 300 and the plurality of barriers 20, and may be made from an insulating material.

In step S400, a via hole is formed in the first passivation layer 41, and a second metal layer 50 is formed on one side of the first passivation layer 41 away from the substrate 10, and the second metal layer 50 is electrically connected to the first metal layer 30 through the via hole.

In step S500, a second passivation layer 42 is provided on one side of the first passivation layer 41 away from the substrate 10, and the second passivation layer 42 covers the second metal layer 50. For the backplane structure obtained after step S500, reference may be made to the backplane in the embodiment shown in FIG. 3. The second metal layer 50 may be made from metal or alloy material, and may be formed into a patterned metal layer. The second metal layer 50 may be connected to different pins of the LED chip as an anode trace and a cathode trace on the backplane respectively.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A backplane comprising:
a substrate;
a plurality of barriers disposed on a surface of the substrate; and
a first metal layer disposed on the surface of the substrate and comprising a plurality of metal patterns spaced apart by the plurality of barriers,
wherein at least one barrier of the plurality of barriers and at least one metal pattern of the plurality of metal patterns are connected by a concave-convex mating structure; and the at least one metal pattern comprises:
a first portion disposed on the surface of the substrate; and
a second portion disposed on a surface of the first portion on one side away from the substrate, and
wherein the at least one barrier and the second portion are connected by the concave-convex mating structure; and the concave-convex mating structure comprises:
a convex portion located on one side of the second portion that is in contact with the at least one barrier, and protruding toward the at least one barrier along a direction parallel to the substrate; and
a concave portion located on one side of the at least one barrier that is in contact with the second portion, and recessed toward one side of the at least one barrier that is away from the second portion, and
wherein the convex portion is embedded in the concave portion, and an outer contour of the convex portion is closely attached to an inner contour of the concave portion.

2. The backplane according to claim 1, wherein a surface of the convex portion on one side adjacent to the first portion is flush with a surface of the second portion on one side adjacent to the first portion.

3. The backplane according to claim 1, wherein a thickness of each of the first metal layer and the plurality of barriers is 10 to 20 μm.

4. The backplane according to claim 1, further comprising:
a first passivation layer disposed on one side of the first metal layer and the plurality of barriers away from the substrate; and
a second metal layer disposed on one side of the first passivation layer away from the substrate, and electrically connected to the first metal layer through a via hole; and
a second passivation layer disposed on one side of the first passivation layer away from the substrate, and covering the first metal layer.

5. A backlight source, comprising:
the backplane according to claim 1; and
a plurality of light-emitting diode chips disposed on the backplane.

6. The backlight source of claim 5, wherein the plurality of light-emitting diode chips comprise a Mini-LED chip or a Micro-LED chip.

7. A display device, comprising:
the backplane according to claim 1.

8. A display device, comprising:
the backlight source according to claim 5.

* * * * *